United States Patent [19]
Jeong

[11] Patent Number: 5,852,693
[45] Date of Patent: Dec. 22, 1998

[54] LOW-LOSS LIGHT REDIRECTION APPARATUS

[75] Inventor: Hwan J. Jeong, Los Altos, Calif.

[73] Assignee: Ultratech Stepper, Inc., San Jose, Calif.

[21] Appl. No.: 756,723

[22] Filed: Nov. 26, 1996

[51] Int. Cl.$^6$ .................................................. G02B 6/26
[52] U.S. Cl. ............................ 385/47; 385/31; 385/36; 385/147; 385/901
[58] Field of Search .................................. 385/44, 46, 47, 385/31, 33, 36, 16, 18, 146, 147, 901; 362/32

[56] References Cited

U.S. PATENT DOCUMENTS

| | | | |
|---|---|---|---|
| 342,030 | 5/1886 | Nelke | 385/147 X |
| 603,799 | 5/1898 | Sullivan | 385/147 X |
| 1,640,096 | 2/1927 | Rosenstein | 385/147 X |
| 3,181,088 | 4/1965 | Lewin et al. | 333/11 |
| 3,511,559 | 5/1970 | Foster | 350/258 |
| 3,870,398 | 3/1975 | Love | 350/96 |
| 3,913,872 | 10/1975 | Weber | 240/41 |
| 4,394,860 | 7/1983 | Smith | 126/439 |
| 4,636,028 | 1/1987 | Mori | 385/44 X |
| 4,669,817 | 6/1987 | Mori | 350/96.15 |
| 4,684,209 | 8/1987 | Mori | 385/44 X |
| 4,699,450 | 10/1987 | Mori | 385/44 X |
| 4,714,313 | 12/1987 | Kapany et al. | 350/96.16 |
| 5,002,365 | 3/1991 | DeJager et al. | 350/166 |
| 5,125,053 | 6/1992 | Abe et al. | 385/36 |
| 5,408,553 | 4/1995 | English, Jr. et al. | 385/36 |

*Primary Examiner*—Brain Healy
*Attorney, Agent, or Firm*—Allston L. Jones

[57] ABSTRACT

The apparatus of this invention redirects light input to the apparatus without significant light loss, and preferably without increasing the light's etendue. The apparatus includes a light guide and a redirection member. The member has input, output and reflective surfaces. The member's input surface is joined to the light guide to define an interface, and the member's output surface is situated adjacent to a medium that can be another light guide or redirection member, a gas such as ambient air, or a vacuum, for example. The member is configured to redirect light traveling in the light guide from its reflective surface by a predetermined redirection angle. To prevent light at the largest spread angle present in the light traveling in the light guide, from traveling into the member, reflecting from the reflective surface and traveling back through the input surface to be lost, the relative refractive indices for the light guide or interface material, and member cause the light from the reflective surface to again reflect internally at the member's input surface. Also, to prevent light from traveling from the light guide through the input surface, the output surface and through the medium at an angle that would result in light loss, the relative refractive indices of the member and medium or interface material cause internal reflection of light in the member at the output surface-medium interface. Accordingly, the apparatus of this invention can redirect light with little or no light loss or increase in etendue. For use in relatively large-scale photolithography, the apparatus can include a plurality of light guides and respective redirection members that are combined to create a large, uniform light field. Also, the redirection members can be implemented as beam splitters optically coupled in succession, whose combined output surfaces generate a relatively large light field of uniform intensity. Groups of beam splitters can also be joined by light guides to produce a plurality of separated light fields.

55 Claims, 13 Drawing Sheets

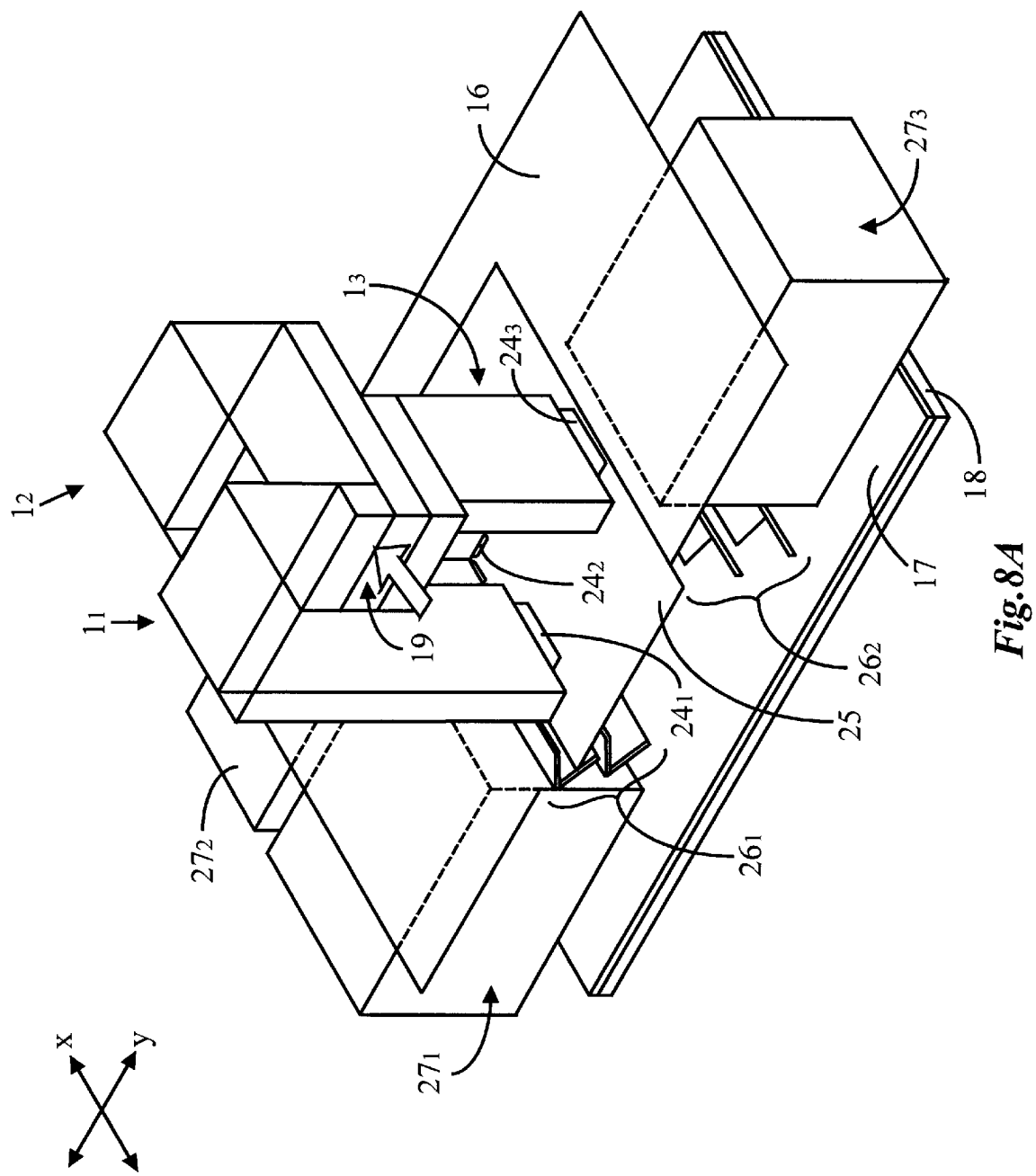

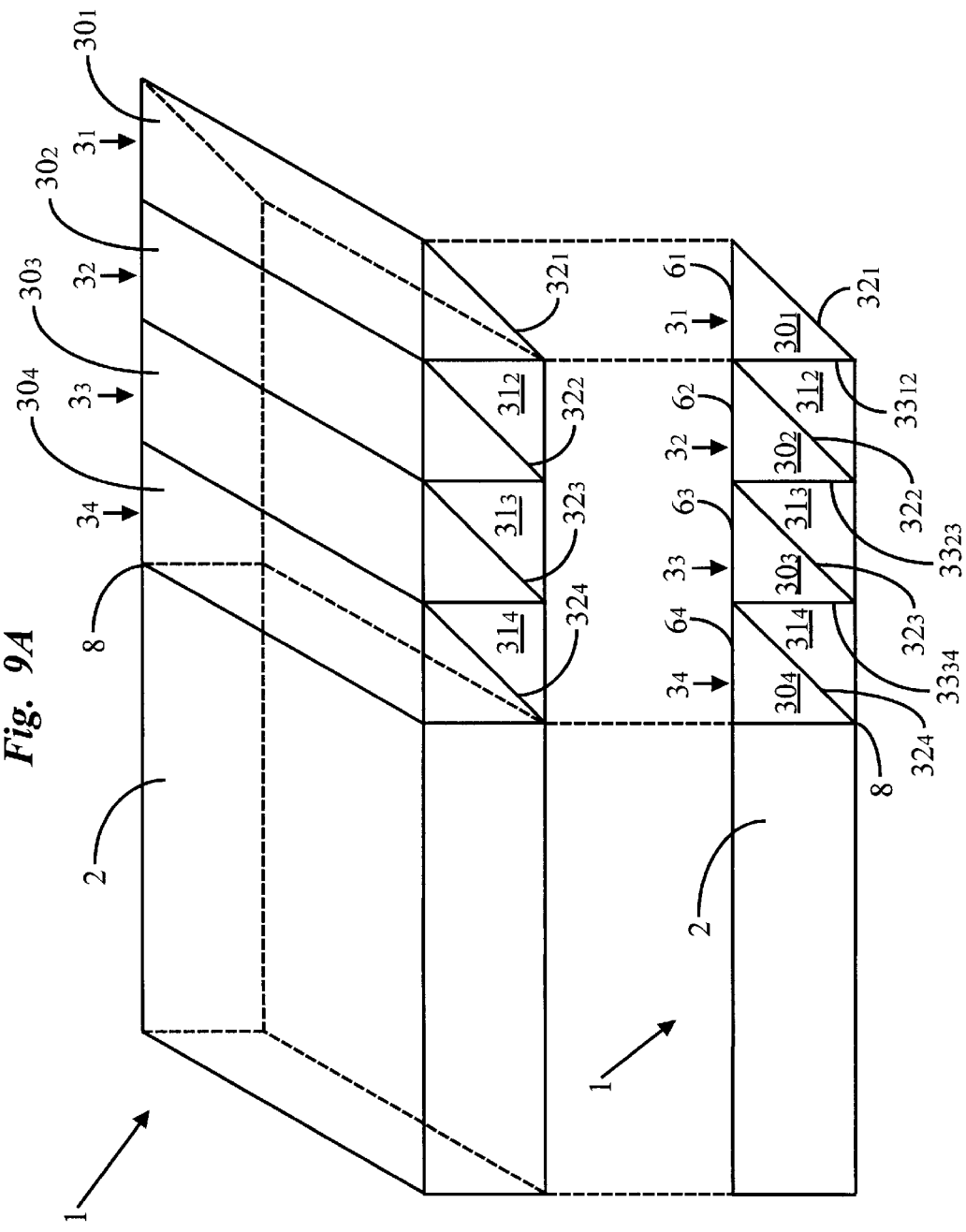

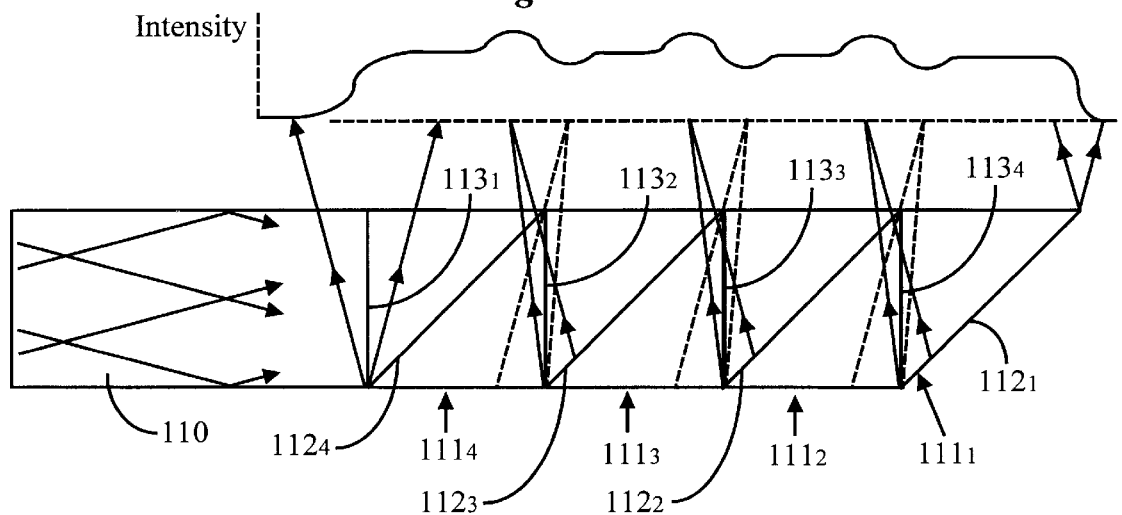
*Fig. 10A*
*Fig. 10B*
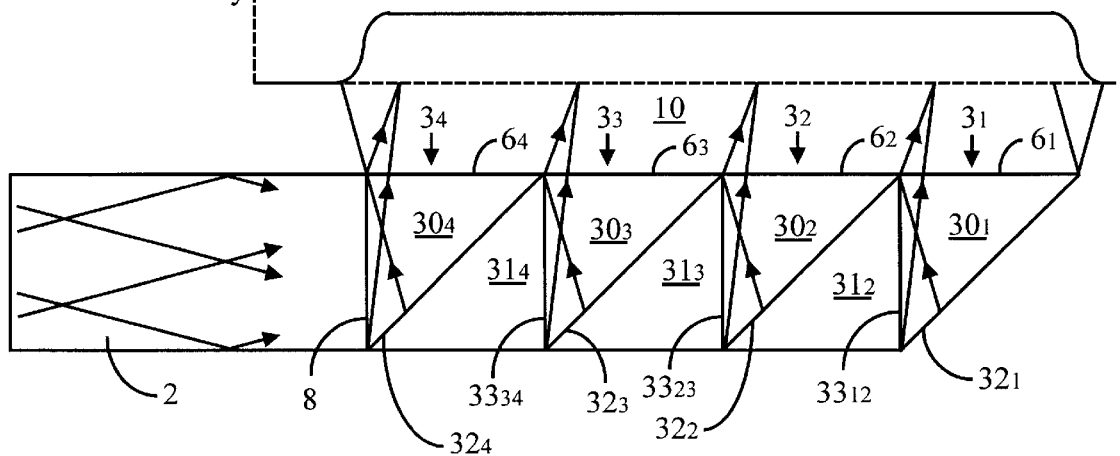
*Fig. 11A*
*Fig. 11B*

LOW-LOSS LIGHT REDIRECTION APPARATUS

BACKGROUND OF THE INVENTION

1. Field of the Invention

This invention is directed to an apparatus that redirects light traveling in one direction, to a different direction, without significant light loss and preferably with little or no increase in the light's etendue. The invention is also directed to an apparatus for redirecting light to create a relatively large light field with a desired intensity profile.

2. Description of the Related Art

In optical systems, guiding and redirecting light from the point of its generation to a remote emission point, is often required for proper system performance. For example, an optical system can require emission of light from a position at which, due to its size, a light source could not be directly placed without disturbance of other system components. Therefore, in such systems, light must be generated, captured, guided and redirected for emission at the appropriate position. In addition, light guiding and redirection can be desirable to create an optical path that renders the optical system more compact and ergonomic in its configuration, and consequently less expensive and easier for an operator to use.

In optical systems, light guides are often coupled together to change the direction of light travel through the coupled guides. FIG. 1 shows an example a coupling of light guides, sometimes referred to as 'light pipes' in this technological field, that results in undesirable light loss. In FIG. 1, light traveling in a light guide 100 travels through a cement interface 101 and into a prism 102. At the back surface of the prism 102, a portion of the light entering the prism reflects back through the interface 101, and passes through and escapes the light guide 100. Another portion of the light entering the prism 102 is lost by passing directly through the interface 101, the prism 102, the interface 103 and the light guide 104. Thus, only light traveling approximately straight through the light guide 100 and reflected from the surface of the prism in a direction to travel approximately straight through the light guide 104, will be successfully redirected and transmitted through the coupled light guides. Due to the light loss, the intensity of the light traveling in the light guide 104 becomes non-uniform along the cross-sectional area of the light guide 104. In many optical systems, non-uniform light renders such systems inoperative. For example, in an optical system application in which the light from the guide 104 is ultimately used to irradiate a reticle to pattern a resist, the resist pattern can be nonuniformly exposed to the light. Therefore, the resulting patterned device can be defective due to over- or under-exposure of the resist pattern.

One solution that can be used to reduce the amount of light lost in the coupled light guides of FIG. 1, is to collimate the light entering the light guide 100 as much as possible, so that a relatively large proportion of light travels through the prism 102 to the light guide 104. However, light collimation requires additional optical elements that can add significantly to the complexity and expense of an optical system using the coupled light guides. Also, for perfect collimation, a point light source must be used. For other than laser sources, existing light sources are only approximately point sources, at best, so perfect collimation is impossible regardless of how many optical elements are used. It would therefore be desirable to provide an optical light guide coupling apparatus that is capable of coupling light guides without significant light loss, even for relatively uncollimated light.

Another problem that occurs in coupling light guides is illustrated in FIG. 2. In the coupled guides of FIG. 2, an increase in 'etendue' occurs. 'Etendue' is defined as the product of the cross-sectional area of the guide and the light beam's solid angular spread. Etendue can at most be preserved in an optical system, but is usually increased at least to some degree by the optical system's elements. For example, in FIG. 2, light from a source travels through light guide 105 and cement interface 106, and enters a prism 107. The light reflects from the back surface of the prism 107, through cement interface 108 and into the light guide 109. Due to the manner in which the light is reflected in the prism 107, the angular spread between the light rays traveling in the light guide 109 has been preserved but the cross-sectional area of guide 109 has been increased. This increase in area proportionally increases the etendue of the light traveling in the light guide 109, and adversely affects the uniformity of the light output from the coupled light guides of FIG. 2. It would be desirable to provide a coupling between light guides that does not increase the etendue of light output from the coupled light guides.

SUMMARY OF THE INVENTION

This invention overcomes the above-noted disadvantages. A first embodiment of the invention is directed to an apparatus that includes a light guide and a redirection member joined together to form an interface. The light guide can be a solid, light-transmissive material such as glass, crystal or plastic, and the redirection member can be a prism or a beam splitter, for example, with input and output surfaces, and a surface opposing the input and output surfaces, that is at least partially reflective. The light guide receives light from a source, and guides the light in its interior, through the interface and into the redirection member along a first general direction. The redirection member receives the light through its input surface, and its reflective surface is angled with respect to the first general direction, to redirect the light to travel in a second general direction. The invented apparatus may also include a light-transmissive medium. The medium can be an additional light guide or redirection member, an interface layer coupled to an additional light guide or redirection member, a gas such as ambient air, or a vacuum, for example, that is situated adjacent to the output surface of the redirection member, to receive the light traveling along the second general direction. Importantly, to prevent the occurrence of light loss or an increase in etendue, the relative refractive indices of the first light guide, the first redirection member, and the medium, spatially confine the light in the redirection member until the light is redirected to travel to the medium along the second general direction. More specifically, the refractive index of the light guide or interface material is made sufficiently smaller than the redirection member's refractive index so that light traveling directly to the reflective surface and reflecting back to the redirection member's input surface is reflected from the light guide-member interface in the second general direction. In addition, light traveling from the light guide directly to the output surface of the member, is totally reflected inside of the member to the reflective surface for redirection to the second general direction before passing to the medium. The interface can be a cement or gel layer, situated between and in contact with the light guide and the redirection member, or can be a gap filled with a gas such as ambient air, or a vacuum, in which case the refractive index of the interface relative to that of the redirection member, can be used to achieve spatial confinement of the light in the redirection member until the redirection member redirects the light from the first to the second general direction. The cement can be sufficiently strong and rigid when cured to hold the light guide in a fixed position relative to the member. Alternatively, if the interface layer is a gel, a gas or a vacuum, a support member can be used to fix the light guide relative to the member. A plurality of light guides and redirection members can be combined together either to obtain one relatively large light field or to redirect light in a more complicated fashion.

The ends of several apparatuses in accordance with the first embodiment of this invention can be joined together in an assembly to produce an input face arranged to receive light from a single source that is used by all of the apparatuses. Each individual apparatus guides and redirects light to their respective separated ends for emission. Each of the apparatuses includes one or more light guides and one or more redirection members with interfaces arranged between the guides and members, in which the refractive indices of the members exceed those of adjacent interfaces or guides, so that light is redirected without loss at each redirection member.

A second embodiment of the invention includes a light guide coupled to a plurality of redirection members arranged in succession. Preferably, at least one of the redirection members is a beam splitter, and the member situated at the apparatus' end can be a prism. The beam splitter(s) have first and second parts with respective partially reflective, partially transmissive first interfaces arranged between respective first and second parts. The first interfaces are arranged parallel to one another and angled relative to a first general direction in which light travels through the beam splitters. Between the light guide and the beam splitter(s), second interfaces are arranged transversely, and preferably normal, to the first general direction. The second interfaces correspond with respective input surfaces of the beam splitters' first parts. A light-transmissive medium situated adjacent to output surfaces of the beam splitters' first parts, receives the light traveling along the second general direction. Advantageously, the relative refractive indices of the first and second parts, the first and second interfaces if they have different refractive indices than those of the first and second parts, and the medium, confine the light reflected from the interfaces in respective first parts of the beam splitters until the light is redirected in the first parts to travel along the second general direction to the medium. Therefore, in the second embodiment of the invention, light is redirected from a plurality of redirection members to provide a relatively large, uniform field of light traveling in the medium. Alternatively, the apparatus can include at least one light guide disposed between a respective pair of beam splitters, to produce a plurality of separated, uniform light fields.

Advantageously, the apparatus of this invention redirects light without significant loss. In addition, the apparatus of this invention can be used to create relatively large, uniform light fields. The large light fields generated by the invented apparatus can be used in integrated circuits, flat panel or micromachining photolithography, or in any other application in which it is desirable to split or combine light fields efficiently without loss of uniformity.

These together with other features and advantages, which will become subsequently apparent, reside in the details of construction and operation as more fully hereinafter described and claimed, reference being made to the accompanying drawings, forming a part hereof, wherein like numerals refer to like parts throughout the several views.

BRIEF DESCRIPTION OF THE DRAWINGS

FIGS. 8A and 8B are perspective views of a system incorporating the illuminator assembly of FIGS. 6 and 7;

FIGS. 9A and 9B are perspective and side elevation views, respectively, of a second embodiment of the invented apparatus;

FIGS. 10A and 10B are a graph of light intensity versus position for a device, and a side elevation view of the device, that suffers from a non-uniform light field output;

FIGS. 11A and 11B are a graph of light intensity versus position for the second embodiment of the invented apparatus, and a side elevation view of the second embodiment of the invented apparatus, that generates a desirable, uniform light field;

DESCRIPTION OF THE PREFERRED EMBODIMENTS

Figure 3:
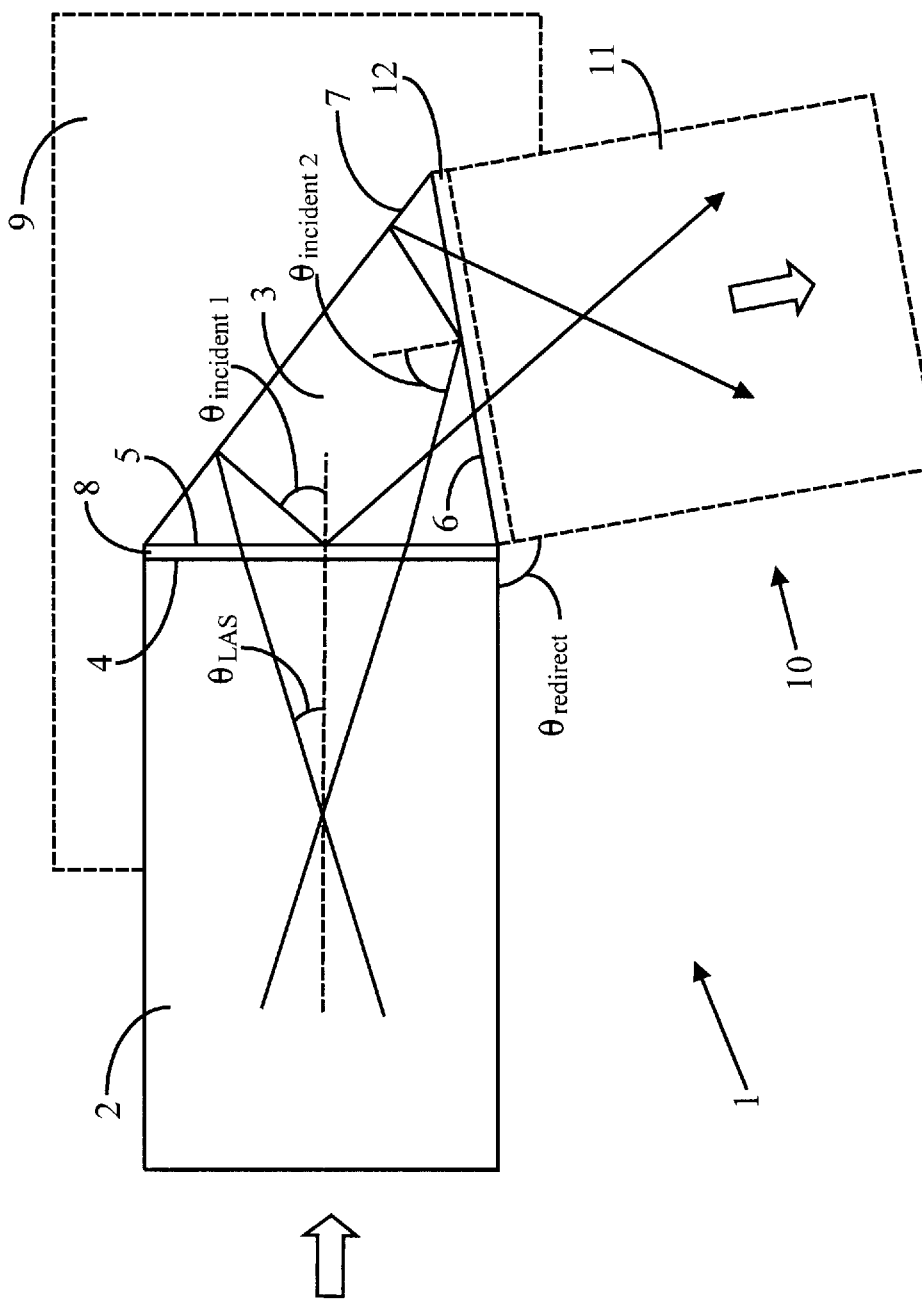
FIG. 3 is a side elevation view of a first embodiment of an apparatus in accordance with this invention.

In FIG. 3, a first embodiment of an apparatus 1 of this invention is shown. The apparatus 1 includes a light guide 2 that serves to receive light at a first end, and to guide the light along a first general direction indicated by the large arrow at the first end of the guide 2 in FIG. 3, to a surface 4 at its second end. Preferably, the light guide 2 (as well as the other light guides yet to be described in detail in this specification) is an optically-transmissive material such as glass or crystal. For example, the light guide 2 can be made from fused-silica glass available from Corning Glass, Inc. of Corning, N.Y., or a glass such as F2 glass, available from Schott, Inc. of Duryes, Pa. or Ohara, Inc. of Kanagawa, Japan. The light guide 2 can also be composed of one or more of a variety of optically-transmissive plastic materials. The light guide 2 can have a variety of shapes and sizes, but is usually desired to be tabular or slab-like in configuration, formed either by cutting and polishing or by molding a suitable material to a predetermined shape. In most cases, the surface 4 is generally desired to be a smooth surface formed, for example, by grinding and polishing the second end of the light guide 2.

The apparatus also includes a redirection member 3 that has an input surface 5, an output surface 6, and a surface 7 that is at least partially reflective. The angle $\theta_{redirect}$ is the angle between the first general direction in which light travels through the light guide 2 to the member 3, and the second general direction in which light leaves the member 3. The member 3 can be made from a suitable material, for example, by cutting and polishing a block of material to a desired shape, or by molding the member from an appropriate material. To make the surface 7 reflective, a reflective substance such as aluminum, titanium or a dielectric coating can be applied to the surface. Such coatings can be applied by a wide variety of commercial sources including Optical Coatings™, Inc. of Santa Rosa, Calif. or CVI™, Inc. of Albuquerque, N.M. Alternatively, the refractive index of the member 3 can be sufficiently high above that of the material immediately behind the surface 7, that surface 7 is substantially reflective. The input surface 5 opposes the surface 4 preferably over its entirety, so that no light escapes at interface 8. Also, the input surface 5 can have the same area and dimension as that of the surface 4 to preserve entendue. The interface 8 can be a relatively abrupt discontinuity between the light guide 2 and the member 3 formed by fusing the surfaces 4, 5 together by the application of heat. Alternatively, the interface 8 can be a layer of light-transmissive cement that holds the light guide 2 and member 3 together, or the interface 8 can be a light-transmissive gel, that optically couples the light guide 2 to the member 3. A large variety of commercially-available cements or gels exist. An ultra-violet (UV)-curable type cement or gel can be used as it does not cure until the application of sufficient ultraviolet light, thus allowing for adjustments of the positions of the light guide 2 and the member 3 before fixing their relative positions. If implemented as a is cement or gel layer, the interface 8 should be at least a few microns in thickness. Preferably, if the cement or gel forming the interface 8 lacks sufficient rigidity, or if the interface 8 is a gas such as ambient air or a vacuum, a support member 9 can be adhered to the light guide 2 and the member 3 to fix their relative positions. Incidentally, in this document, additional references to 'members' will signify that such 'members' can be the same or similar to the member 3 described above.

The apparatus 1 can also include a light-transmissive medium 10 arranged adjacent to the output surface 6 of the member 3. The medium 10 can include a component 11 which can be an additional light guide or redirection member. In addition, the medium can be a gas such as ambient air, or a vacuum. The medium can also include an interface layer 12 coupled to or situated adjacent to the component 11, such as a cement or gel layer, or a gap filled with a gas such as ambient air, or a vacuum. If the medium is implemented as the interface layer coupled to the component, the component and the member 3 can be adhered or otherwise attached to the support member 9 for reinforcement if the interface layer does not provide sufficient strength or adhesion to hold the component in position relative to the member 3. If the medium includes the component 11, the input surface of the component should oppose the entirety of the member's output surface 6 to avoid light loss. Also, the area and dimension of the component's input surface can be the same as that of the member's output surface, to prevent an increase in entendue.

Light passing from the light guide 2 through the interface 8 and into the interior of the member 3 can travel directly to the reflective surface 7 where it is reflected back to the interface 8. To prevent this reflected light from being lost by escaping the member 3 and passing back into the light guide 2, in accordance with this invention, the interface 8 is made totally reflective to his reflected light by forming the member 3 from a material that has a refractive index sufficiently higher than the refractive index of the light guide 2 or the material, gas or vacuum defining the interface 8. More specifically, the refractive indices of the member 3 and the light guide 2 should satisfy the following equation:

$$\sin \theta_{incident1} > \text{the smaller of } \frac{n_{lightguide1}}{n_{member}} \text{ or } \frac{n_{interface1}}{n_{member}} \quad (1)$$

where $\theta_{incident1}$ is the largest angle of incidence of the light reflected from the surface 7 that is directed to the surface 5, $\eta_{lightguide1}$ is the refractive index of the light guide 2, $\eta_{member}$ is the refractive index of the member 3, and $\eta_{interface1}$ is the refractive index of the interface 8. There can be light loss by so-called evanescent wave in the interface region. However, this kind of light loss can be prevented by making the angle $\theta_{incident1}$ slightly larger (e.g., by one degree) than the absolute minimum dictated by equation (1). The angle $\theta_{incident1}$ can be determined empirically for a given configuration of the light guide 2, the member 3, and the interface 8. Alternatively, the angle $\theta_{incident1}$ can be calculated if the redirection angle $\theta_{redirect}$ and the largest angular spread $\theta_{LAS}$ relative to the first general direction of light traveling in the light guide 2 toward the interface 8, are known. The redirection angle $\theta_{redirect}$ is predetermined by the application or system in which the apparatus 1 is to be used. The largest angular spread $\theta_{LAS}$ can be determined empirically or calculated using basic geometry and Snell's law, by analyzing the light path from the source to the light guide 2. More specifically, in a case in which the input surface of the light guide 2 is perpendicular to the general direction of light travel in the light guide 2, the sine of the largest angular spread $\theta_{LAS}$ in the light guide 2 is equal to the sine of the largest angle of light input into the guide 2, divided by the refractive index of the light guide $\eta_{lightguide1}$. Alternatively, the calculation of the largest angular spread $\theta_{LAS}$, can be performed with one of a wide variety of lens design software packages such as "Code V™" commercially available for license from Optical Research Associates™, Inc. of Pasadena, Calif..

In addition, light passing from the light guide 2 through the interface 8 and into the interior of the member 3 can travel directly to the output surface 6. To prevent this light from passing through output surface 6 to the medium 10 at an angle that would cause the light to be lost, the member 3 is made of a material with a refractive index that is sufficiently high above that of the medium 10 (more specifically, a gas such as ambient air or a vacuum, or alternatively, the component 11 and the interface 12). Thus, light incident directly from the interface 8 to the output surface 6, is totally internally reflected from the member's output surface until redirected along the second general direction by reflection from the reflective surface 7. More specifically, if the medium 10 includes the component 11 and the interface 12, the refractive indices of the member 3 and the light guide 2 should satisfy the following equation:

$$\sin \theta_{incident2} > \text{the smaller of } \frac{n_{component}}{n_{member}} \text{ or } \frac{n_{interface2}}{n_{member}} \quad (2)$$

where $\theta_{incident2}$ is the angle of incidence of the light traveling directly from the interface 8 to the member's output surface 6, $\eta_{component}$ is the refractive index of the component 11, and $\eta_{interface2}$ is the refractive index of the interface 12. Alternatively, if the medium 10 is a gas such as ambient air, a vacuum or some other medium in contact with the output surface 6, for example, equation (2) is replaced with:

$$\sin \theta_{incident2} > \frac{n_{medium}}{n_{member}} \quad (3)$$

where $\eta_{medium}$ is the refractive index of the medium. In equations (2) and (3), the angle $\theta_{incident2}$ depends upon the redirection angle $\theta_{redirect}$ and the largest angular spread $\theta_{LAS}$ of the light traveling from the light guide 2 to the member 3. There can be light loss due to so-called evanescent wave in the interface region, but this light loss can be prevented by making the angle $\theta_{incident2}$ slightly larger (for example, by one degree) than the absolute minimum dictated by equations (2) or (3). Thus, the angle $\theta_{incident2}$ can be determined in a manner similar to one of the several above-described ways for determining the angle $\theta_{incident1}$.

It is also possible to empirically determine if the refractive indices $\eta_{interface1}$ (if the gel, cement, gas or vacuum interface layer 8 is used), $\eta_{member}$, $\eta_{medium}$ (including $\eta_{component}$ if no gel, cement, gas or vacuum interface layer is used, or $\eta_{component}$ and $\eta_{interface2}$ if the gel, cement, gas or vacuum interface layer 12 is used with the component 11) satisfy equation (1) or (2) by assembling the light guide 2 and the member 3 (with interface layers 8, 12 or the component 11, if used), and determining whether total internal reflection occurs. For example, by arranging light sensors outside of the member 3 and the medium 10 at locations where light would escape the apparatus if not internally reflected in the member 3, the resulting apparatus can be checked for light loss. Alternatively, the output light intensity through the light guide 2, the interface 8, the member 3 through the medium 10, can be compared with the input light intensity, to determine if total internal reflection occurs in the member 3. If the apparatus is not totally internally reflecting the light, one or more of the light guide 2, the member 3, the interface layers 8, 12 and component 11, if used, can be formed from a different material tending to increase the refractive index of the member 3 above those of the light guide 2, the interface layers 8, 12 and the component 11 until total internal reflection occurs in the member 3 for light reflected from the surface 7 back to the surface 5 and for light incident to the output surface 6 directly from the light guide 2 and interface 8.

It should be appreciated that the apparatus 1 is equally effective to redirect light without loss if, rather than inputting light at the input side of guide 2 and redirecting light to the medium 10 as described above, the light is input from the medium 10 and output from the guide 2. This use of the apparatus 1 is also considered to be within the scope of this invention.

Figure 1:
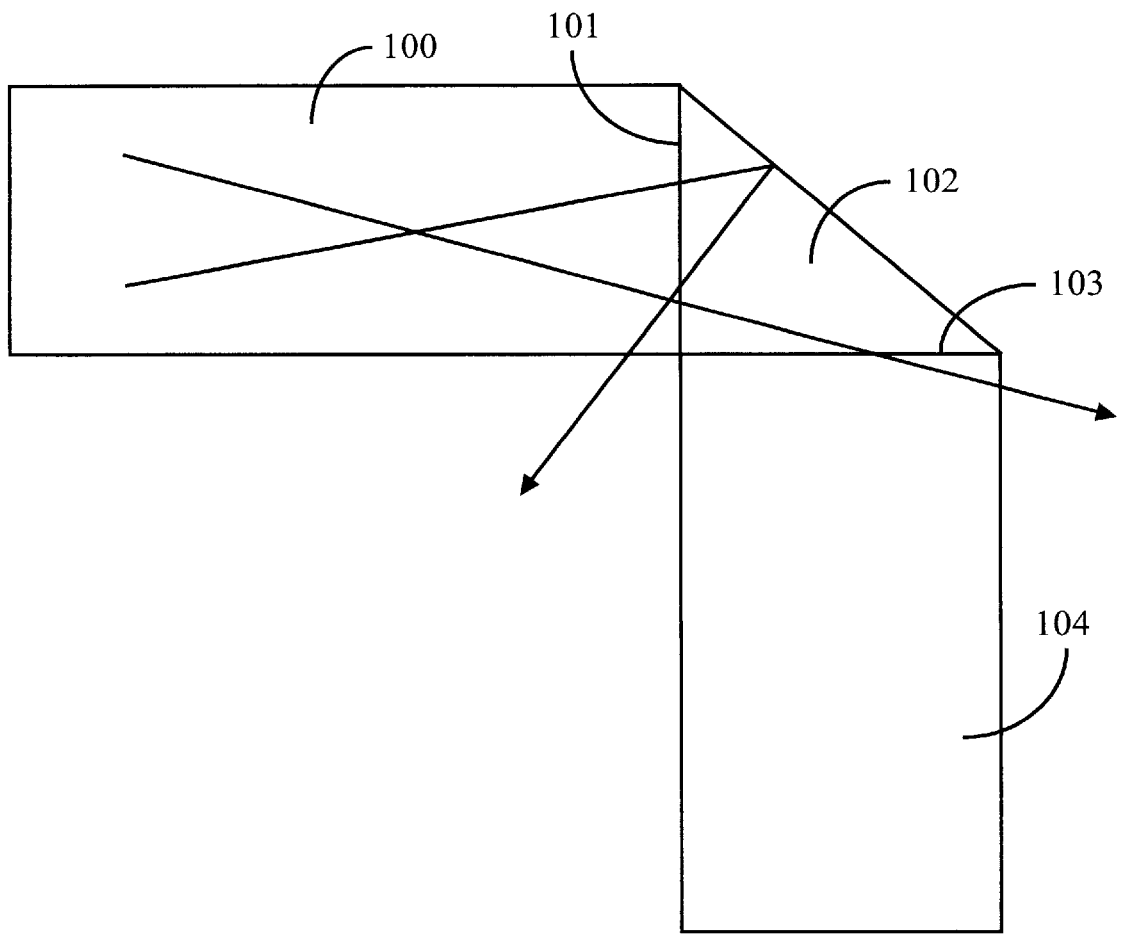
FIG. 1 is a side elevation view of a coupling for two light guides that suffers from light loss.
Figure 2:
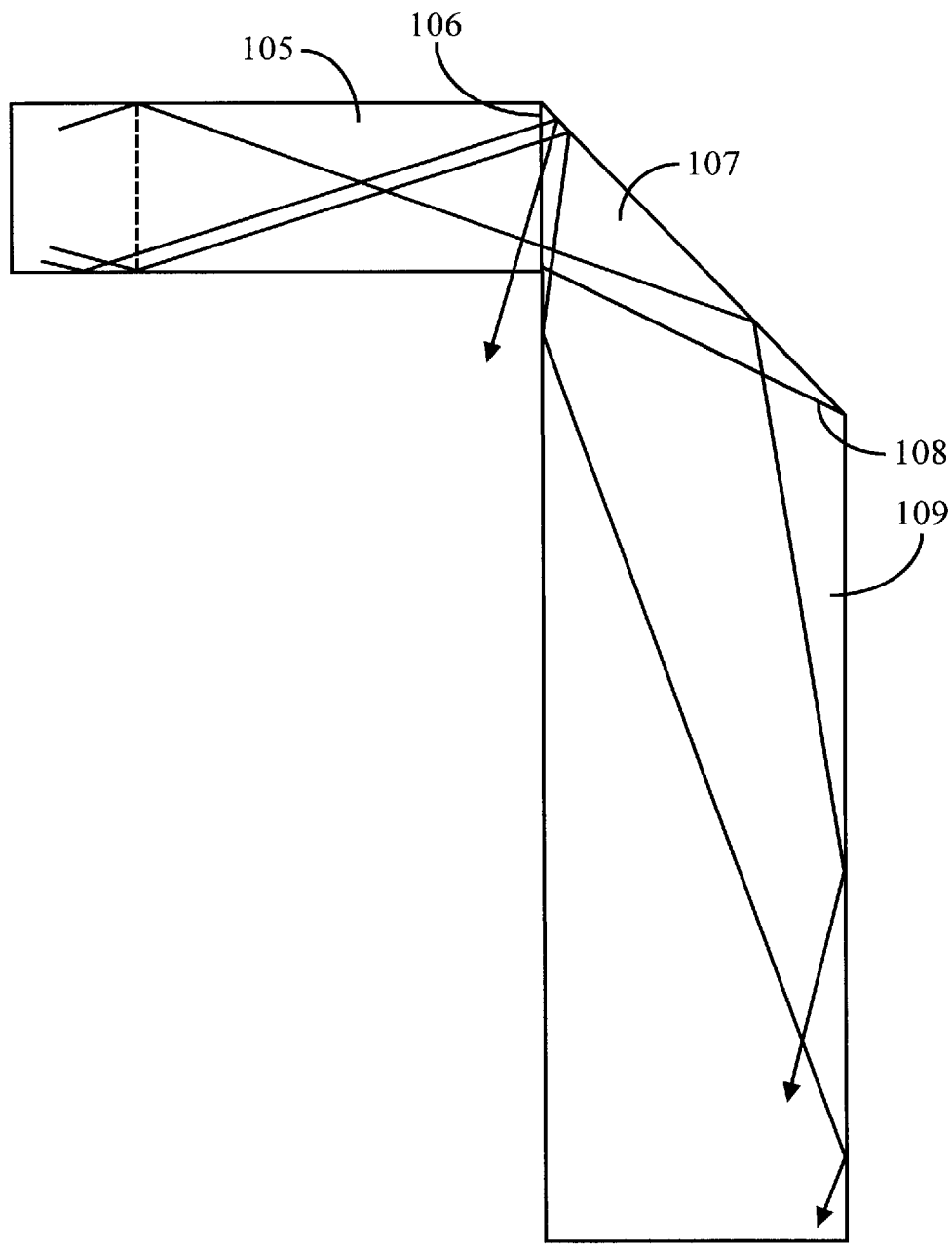
FIG. 2 is a side elevation view of a coupling for light guides, that produces an undesirable increase in etendue of light traveling through the coupled guides.
Figure 4:
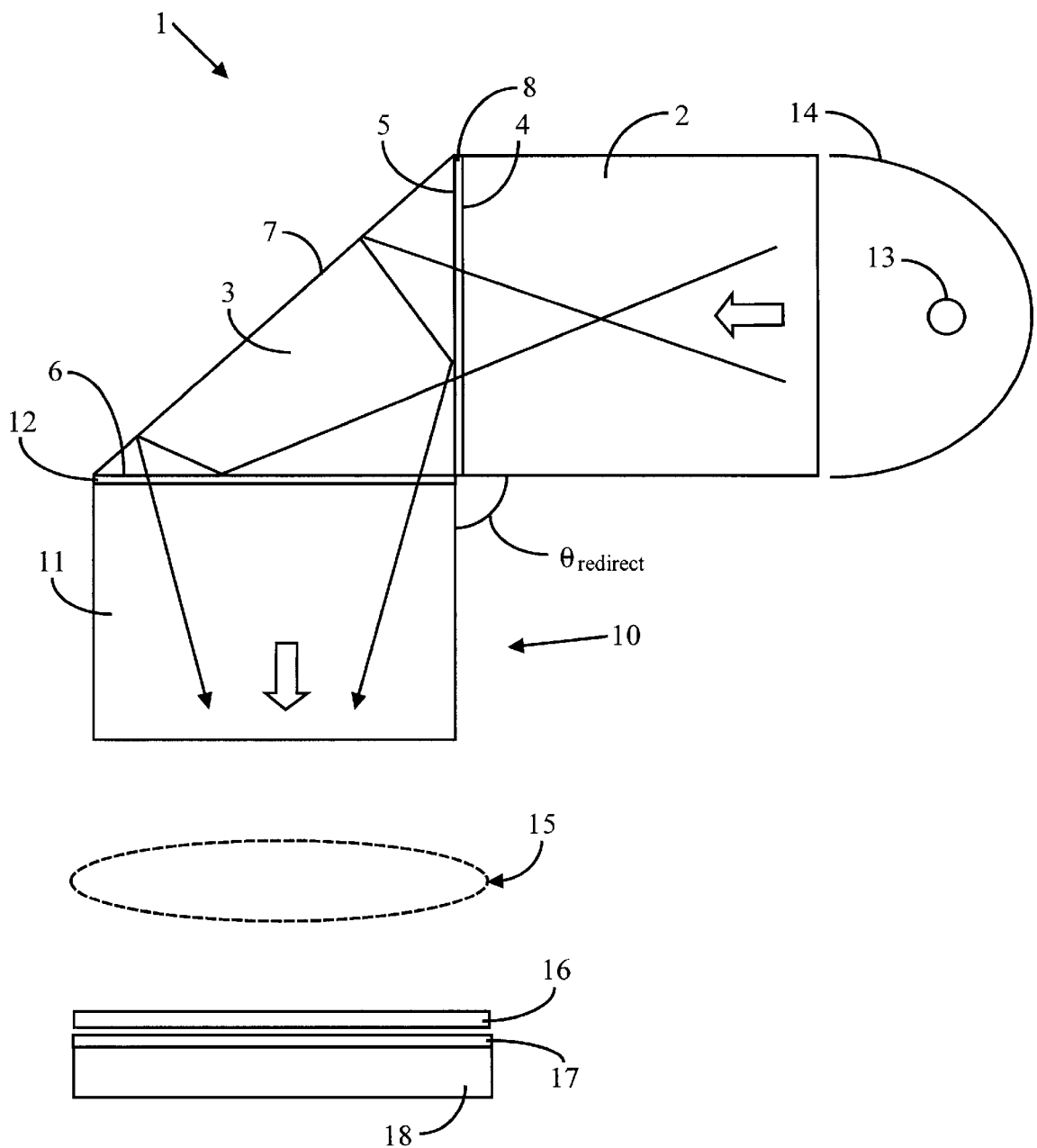
FIG. 4 is a cross-sectional side view of a first system incorporating the first embodiment of the apparatus.

FIG. 4 shows a system incorporating a first embodiment of the apparatus 1. The input end of the light guide 2 receives light either directly from a source 13, or indirectly by reflection of light generated by the source, from a reflector 14 that is preferably parabolic in shape (as used in this document, the term 'reflector' is intended to include a mirror or the like within its meaning). The light source can be a mercury lamp, for example. As described with respect to the apparatus of FIG. 1, the relative refractive indices of the light guide 2, the member 3, the component 11 (and the interfaces 8, 12 if either has a refractive index that differs from those of the member 3 and respective light guides 2, 11) are such that the light reflected back to the interface 8 from the surface 7, is totally internally reflected in the member 3, and the light incident to the interface 12 directly from the light guide 2 and the interface 8, is totally internally reflected in the member 3 for redirection along the second general direction at the predetermined angle $\theta_{redirect}$ relative to the first general direction of light travel in the light guide 2. The light output along the second general direction passes from the component 11, that in FIG. 4 is implemented as a light guide, to one or more optical elements 15 to condition the light by filtration or by shaping the light beam, for example, for irradiation of a pattern defined by reticle 16. The light pattern from the reticle 16 is copied on the resist layer 17 disposed on the substrate 18 that is placed in close proximity to the reticle 16. Alternatively, the reticle 16 can be positioned farther away from the substrate 18 by using an additional optical element(s) (not shown) such as a lens situated between the reticle 16 and the substrate 18. The patterned resist layer 17 can subsequently be used to selectively dope or etch the substrate 18 to produce semiconductor devices or machine components having highly-precise configurations. The light source 13, the reflector 14, the apparatus 1, the elements 15, reticle 16 and substrate 18 are supported relative to one another with supports or a common housing (not shown), that can be readily constructed and used by those of average skill in this technology.

Figure 5:
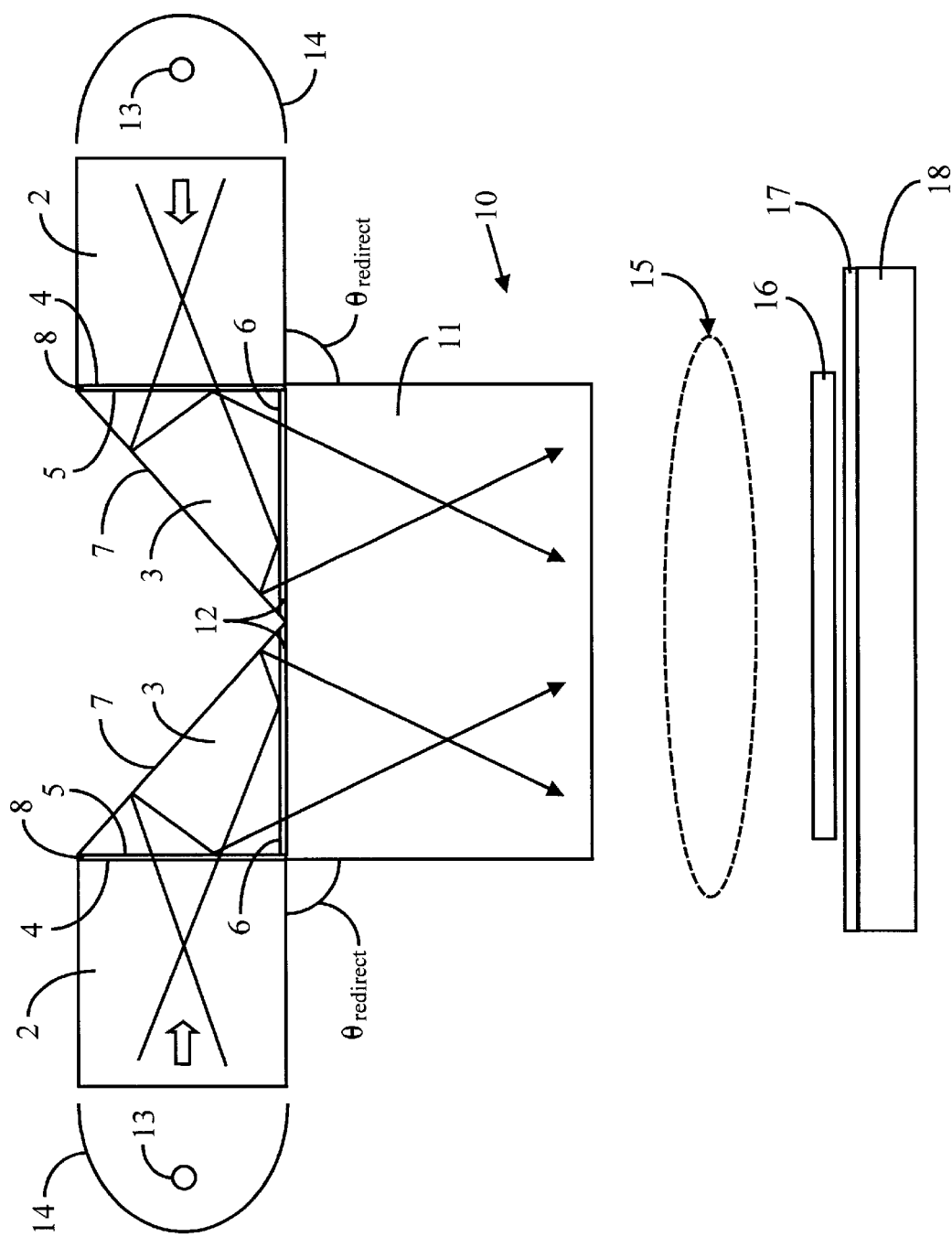
FIG. 5 is a cross-sectional side view of a second system incorporating the first embodiment of the apparatus.

FIG. 5 shows another exemplary system incorporating two apparatuses 1 of this invention. The two light guides 2 receive light generated by sources 13 such as mercury lamps, that have reflectors 14 arranged to direct light into the ends of respective light guides 2. The output surfaces 6 of the two apparatuses 1 are both coupled to a relatively large component 11, that is a light guide in FIG. 5, by interfaces 12, to produce a relatively large light field traveling along the second general direction in the component 11. The light from the component 11 travels to the optical element(s) 15 for conditioning by filtration and shaping, for example, and passes to the reticle 16. The reticle 16 generates a light pattern that exposes the resist layer 17 that is placed in close proximity to the reticle 16. Alternatively, the reticle 16 can be positioned farther apart from the substrate 18 through the use of additional optical element(s) (not shown) situated between the reticle 16 and the substrate 18. The resist layer can thus be used for selective doping or etching or the like, of the substrate 18. The light sources 13, the reflectors 14, the apparatuses 1, the optical element(s) 15, the reticle 16 and the substrate 18, are held in position relative to one another with suitable supports or a common housing, for example. Such supports and housing are well-known and understood, and persons of average skill in this technology can readily construct and use such supports or housing.

Figure 6:
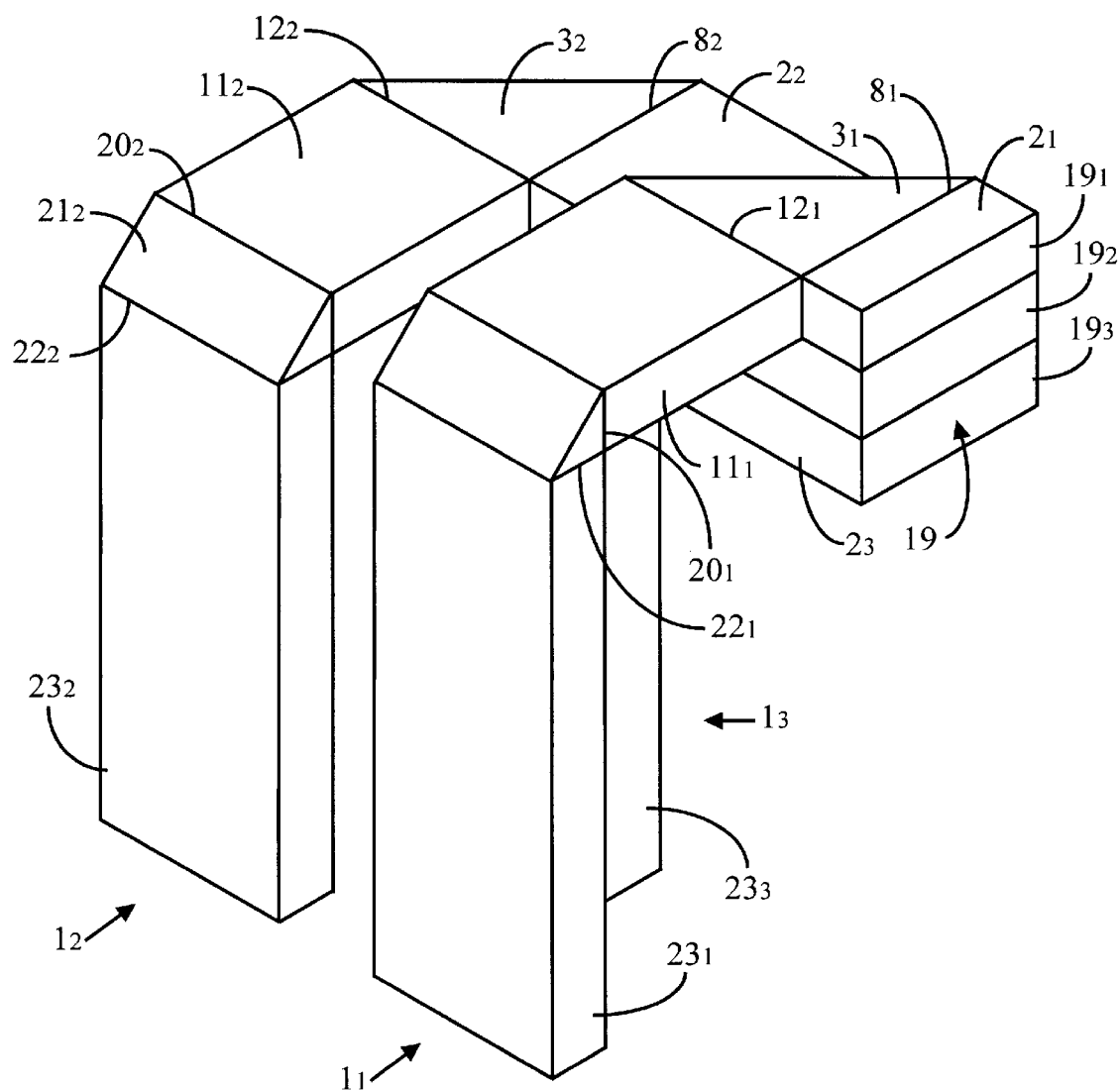
FIG. 6 is a perspective view of an illuminator assembly that includes three combined apparatuses of the first embodiment of the invention.

FIG. 6 is a perspective view of an illuminator that includes an assembly of three examples of apparatuses of the first embodiment of this invention. More specifically, the illuminator of FIG. 6 includes a plurality of apparatuses $1_1$, $1_2$, $1_3$ fixed together with cement or held together by a device such as a clamp or vice (not shown), for example. The plurality of apparatuses $1_1$, $1_2$, $1_3$ have end surfaces $19_1$, $19_2$, $19_3$ juxtaposed to define a common light input face 19. Each of the apparatuses guides and redirects light through respective light guides and redirection members, to direct light to three separate locations for emission. More specifically, the apparatuses direct light through respective coupled light guides $2_1$, $2_2$, $2_3$ and interfaces $8_1$, $8_2$, $8_3$ (interface $8_3$ is not visible in the view of FIG. 6) along the x-direction in FIG. 6. The coupled light guides $2_1$, $2_2$, $2_3$ differ in length the guide $2_1$ being relatively short, the light guide $2_3$ being relatively long, and the light guide $2_2$ having a length between those of the light guides $2_1$, $2_3$. The interfaces $8_1$, $8_2$, $8_3$ couple respective output surfaces of the light guides $2_1$, $2_2$, $2_3$ to respective input surfaces of the redirection members $3_1$, $3_2$, $3_3$ (member $3_3$ is not visible in the view of FIG. 6), that redirect light along the y-direction in FIG. 6. Interfaces $12_1$, $12_2$ couple the output surfaces of the redirection members $3_1$, $3_2$ to respective light guides $11_1$, $11_2$. The apparatus $1_3$ has no equivalent light guide, as it is coupled directly to another redirection member. The light guides $11_1$, $11_2$ are equal in length and direct light to respective interfaces $20_1$, $20_2$ that are in turn coupled to redirection members $21_1$, $21_2$. The redirection members $21_1$, $21_2$ redirect light along the z-axis direction in FIG. 6. With respect to the apparatus $1_3$, the interface $12_3$ (interface $12_3$ is not shown in the view of FIG. 6) couples the output surface of the redirection member $3_3$ to the input surface of redirection member $21_3$ (member $21_3$ is not visible in the view of FIG. 6) that redirects light along the z-axis direction in FIG. 6. The output surfaces of the redirection members $21_1$, $21_2$, $21_3$ are coupled via respective interfaces $22_1$, $22_2$, $22_3$ (interface $22_3$ is not visible in the view of FIG. 6) to the input surfaces of light guides $23_1$, $23_2$, $23_3$ that guide the light along their respective, equal lengths to their respective output surfaces for emission at separate locations. Preferably, for the particular use for which the illuminator assembly is used (yet to be described with respect to FIGS. 8A and 8B), the guides and members in the apparatuses $1_1$, $1_2$, $1_3$ are sufficiently wide so that adjacent light fields generated at the ends of the apparatuses overlap to a degree along the x-axis direction in FIG. 6. The redirection members $21_1$, $21_2$, $21_3$ and the light guides $11_1$, $11_2$, $23_1$, $23_2$, $23_3$ are similar in function, although not in shape, to the redirection members $3_1$, $3_2$, $3_3$ and light guides $2_1$, $2_2$, $2_3$, respectively. Accordingly, a detailed description of these redirection members and light guides is not necessary and is omitted as redundant. The interfaces $20_1$, $20_2$, $20_3$, $22_1$, $22_2$, $22_3$ can be realized with the same materials or media as, and are similar in structure and function to, the interfaces $8_1$, $8_2$, $8_3$. It should be noted that the particular configuration of the illuminator of FIGS. 6 and 7 is given by way of illustration, and not limitation, and that fewer or more apparatuses 1 can be juxtaposed and used to route light in different directions to respective separated locations for emission.

Figure 7:
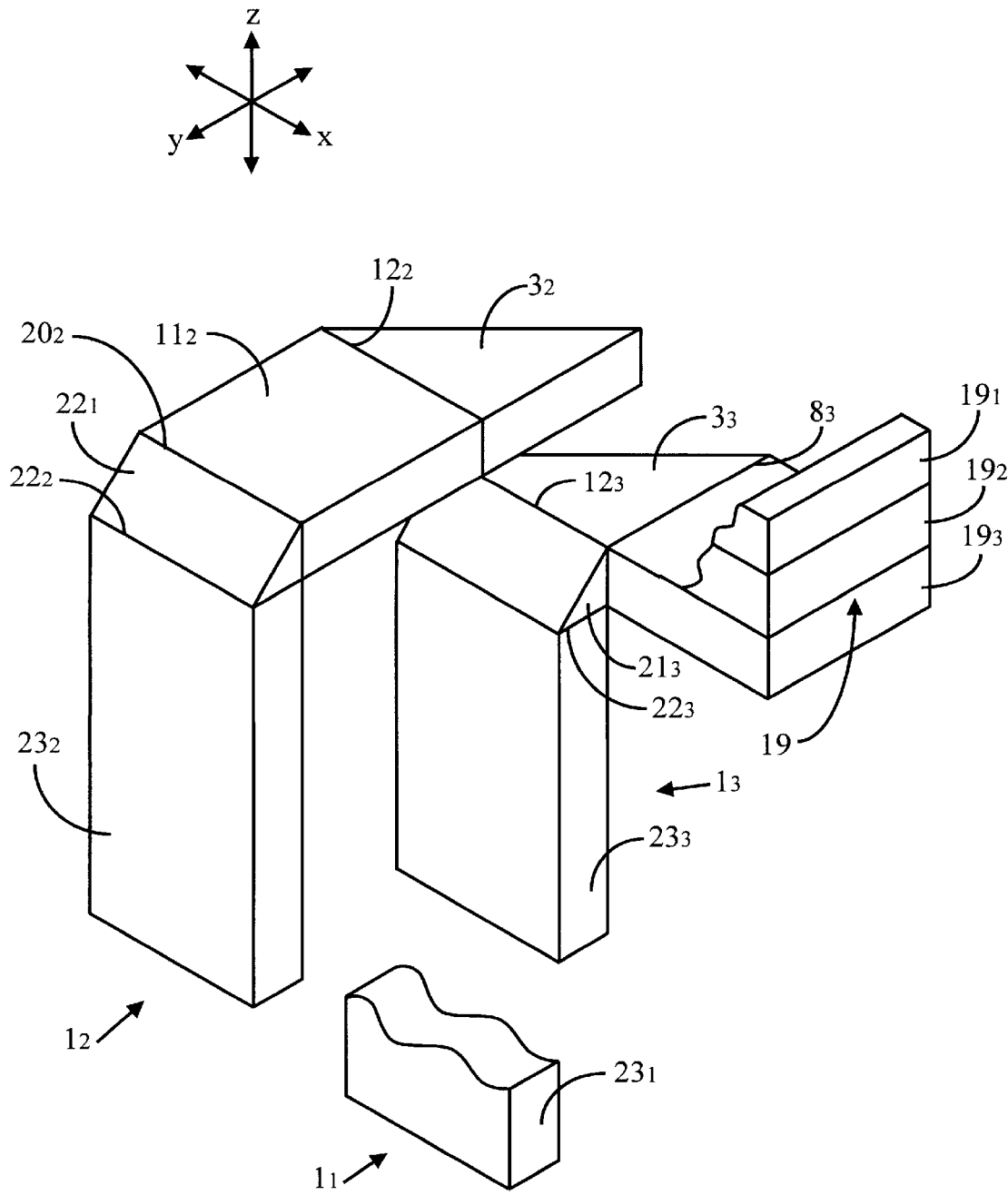
FIG. 7 is a perspective partial cutaway view of the illuminator assembly of FIG. 6.

FIG. 7 is a perspective cutaway view of the illuminator assembly of FIG. 6. The members $3_3$, $21_3$ and coupling interfaces $8_3$, $12_3$, $22_3$ that were not visible in the view of FIG. 6, can be seen in the view of FIG. 7.

FIG. 8A is a view of a scanning array lens lithography (SALLY™) system incorporating the illuminator of FIGS. 6 and 7. In FIG. 8A, the illuminator receives light from a source at its input face 19. The light is divided by illumination into the three apparatuses $1_1$, $1_2$, $1_3$. The respective output ends of the apparatuses $1_1$, $1_2$, $1_3$ illuminate respective apertures $24_1$, $24_2$, $24_3$ defined in an opaque sheet 25. The light shaped by the apertures $24_1$, $24_2$, $24_3$ passes through the pattern defined in the reticle 16 that selectively blocks light to generate patterned light. The patterned light passes from the reticle to a respective first of a series of two fold mirrors $26_1$, $26_2$ that are V-shaped in cross-section, and arranged to oppose dual lens modules $27_1$, $27_2$, and $27_3$ as disclosed in PCT International Publication No. WO 96/25681 issued Aug. 22, 1996. The modules $27_1$, $27_2$, $27_3$ output light to respective second mirrors $26_1$, $26_2$ that direct the light patterned by the reticle 16, to the resist layer for selective illumination. The reticle 16 and the substrate 18 are preferably commonly supported by a support(s)(not shown) that is movable relative to the other elements of FIG. 8A. More specifically, the reticle 16 and the substrate 18 can be moved together in only the y-direction or, alternatively, in the x-y plane, relative to the illuminator that includes apparatuses $1_1$, $1_2$, $1_3$, the sheet 25, the fold mirrors $26_1$, $26_2$ and the dual lens modules $27_1$, $27_2$, $27_3$. The illuminator, sheet, mirrors and modules are preferably also supported by respective support(s)(not shown). The reticle 16 and the substrate 18 are moved along the y-axis direction relative to the illuminator, sheet, mirrors and modules of FIG. 8A, to illuminate an area of the resist layer 17 having the combined width of the apertures $24_1$, $24_2$, $24_3$, and extending across the substrate in the x-direction. If the support(s) for the reticle 16 and the substrate 18 can be moved in the x-axis direction as well as the y-axis direction, the reticle and substrate are then moved along the x-axis direction to the next row of the substrate to be irradiated, and then along the y-axis direction relative to the illuminator, sheet, mirrors and modules, in a reverse direction to that of the previous row. Through successive illumination of rows of the resist layer 17, a relatively large area of resist layer can be uniformly exposed.

Figure 8B:
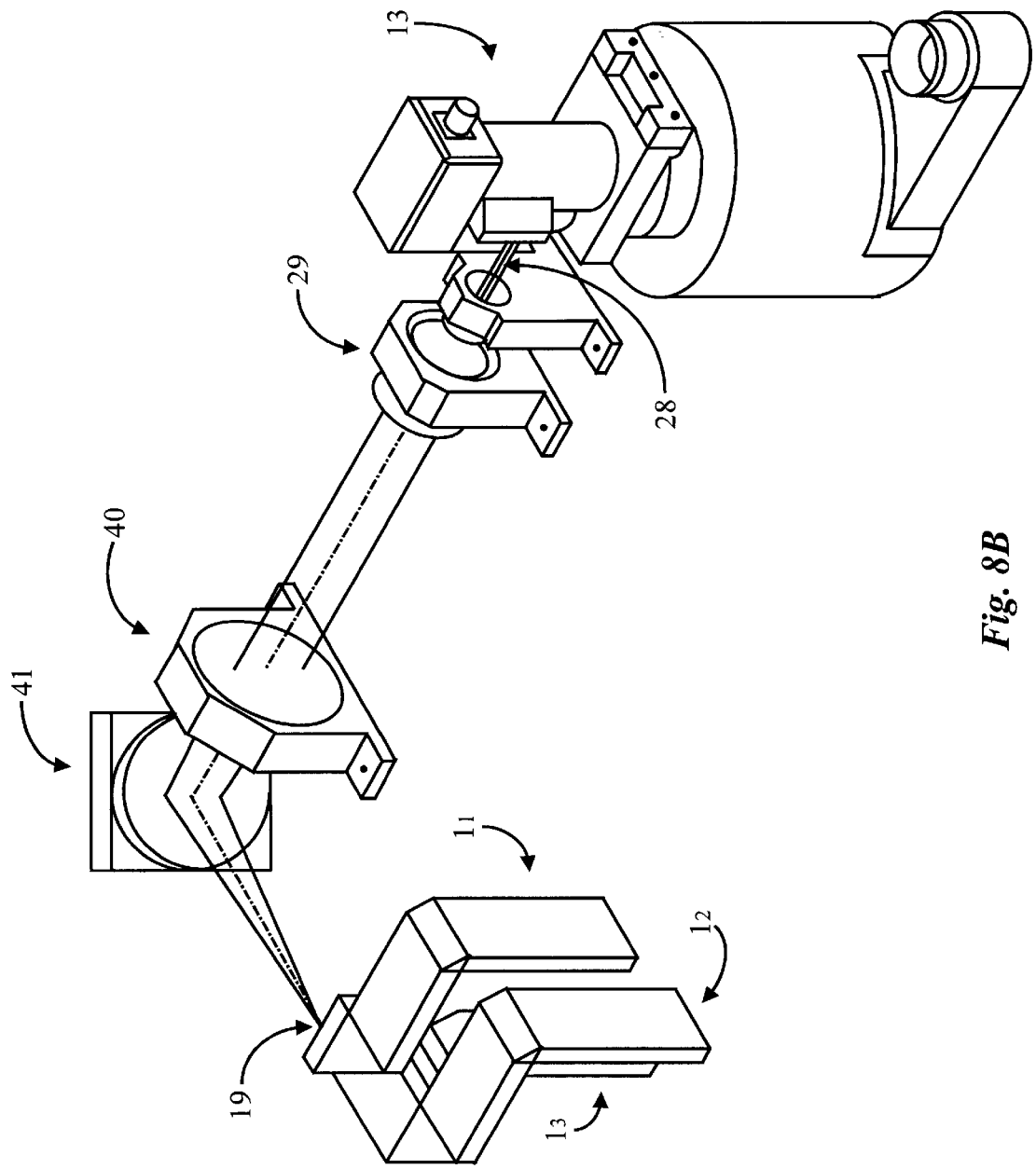

FIG. 8B is a perspective view of a part of the SALLY™ system showing the elements that generate and direct light to the illuminator assembly's input face 19. Light is generated by a light source 13 that, in FIG. 8B, is a mercury lamp. A light pipe 28 has one end coupled to receive the light from the source 13, and guides the light to optical elements 29, 40 that serve to filter and shape the light beam to conform in size to the illuminator assembly's input face 19. A fold mirror 41 receives light from the optical element 40, and directs the received light to the input face 19. The light source 13, light pipe 28, optical elements 29, 40 and fold mirror 41, are preferably supported by a support surface(s) (not shown) so as to be fixed relative to the illuminator which includes apparatuses $1_1$, $1_2$, $1_3$, the sheet 25, the fold mirrors $26_1$, $26_2$ and the dual lens modules $27_1$, $27_2$, $27_3$ of FIG. 8A, but the reticle 16 and the substrate 18 are movable relative to these elements.

FIGS. 9A and 9B are views of a second embodiment of this invention. In FIGS. 9A and 9B, a plurality of light redirection members $3_1$, $3_2$, $3_3$, $3_4$ are arranged in succession. The members $3_2$, $3_3$, $3_4$ are preferably implemented as beam splitters and the first member $3_1$ is preferably implemented as a prism similar to the member 3 of FIG. 3 with a totally reflective surface 7. The second embodiment of the apparatus 1 can be used to generate a relatively wide light field from the combined output surfaces $6_1$, $6_2$, $6_3$, $6_4$, with a desired predetermined light intensity profile. The members $3_2$, $3_3$, $3_4$ are composed of respective first parts $30_2$, $30_3$, $30_4$ and second parts $31_2$, $31_3$, $31_4$ joined together at respective interfaces $32_2$, $32_3$, $32_4$. The interfaces $32_2$, $32_3$, $32_4$ are partially transmissive and partially reflective to light to perform the beam splitting function of the members $3_2$, $3_3$, $3_4$. The interfaces $32_2$, $32_3$, $32_4$ can be formed by making the first parts $30_2$, $30_3$, $30_4$ of respective materials with different refractive indices than those of respective second parts $31_2$, $31_3$, $31_4$ and the light guide 2, and by joining respective first parts $30_2$, $30_3$, $30_4$, the second parts $31_2$, $31_3$, $31_4$ and the light guide 2 together. Alternatively, the interfaces $32_2$, $32_3$, $32_4$ can be formed from respective cement, gel or dielectric layers with respective light transmissivities (or conversely, reflectances) to obtain a predetermined light intensity profile. If implemented as a cement or gel layer that lacks sufficient strength or rigidity to hold the light guide 2 and the members $3_1$, $3_2$, $3_3$, $3_4$ together, a support member (not shown) similar to support member 9 of FIG. 3, can be used to hold the light guide 2 and the members $3_1$, $3_2$, $3_3$, $3_4$ together. Alternatively, the members $3_2$, $3_3$, $3_4$ with such interfaces $32_2$, $32_3$, $32_4$ are available from a variety of commercial sources, including Optical Coatings, Inc. of Santa Rosa, Calif. and CVI, Inc. of Albuquerque, N.M. The first member 31 preferably includes a part $30_1$ with a totally reflective surface $32_1$. The members $3_1$, $3_2$, $3_3$, $3_4$ are joined together at respective interfaces $33_{12}$, $33_{23}$, $33_{34}$ that can be formed by fusing adjacent members together or optically coupling the members together with cement, gel or other suitable substance.

If the first parts $30_2$, $30_3$, $30_4$ and respective second parts $31_2$, $31_3$, $31_4$ and interfaces $32_2$, $32_3$, $32_4$ had the same refractive indices, a configuration that is undesirable and not preferred in this invention, the resulting ray trace would appear as shown in FIG. 10B and the resulting intensity profile as shown in FIG. 10A. In FIGS. 10A and 10B, an optical component 110 is coupled to members $111_4$, $111_3$, $111_2$, $111_1$ with respective partially reflective, partially transmissive interfaces $112_4$, $112_3$, $112_2$, and totally reflective surface $112_1$ separated by interfaces $113_4$, $113_3$, $113_2$, $113_1$. In FIG. 10B, because the light traveling in any particular one of the members $111_1$, $111_2$, $111_3$, $111_4$ can be reflected back to the member or light guide optically upstream from the particular member, the resulting light intensity output by the members $111_1$, $111_2$, $111_3$ is highly non-uniform, as shown in FIG. 10A.

Advantageously, in the second embodiment of the apparatus 1 shown in FIGS. 9A, 9B, 11A and 11B, the relative refractive indices of the first parts $30_1$, $30_2$, $30_3$, $30_4$ and respective second parts $31_2$, $31_3$, $31_4$, the light guide 2, the medium 10 and interfaces 8, $33_{12}$, $33_{23}$, $33_{34}$ (if the interfaces have different refractive indices than those of the light guide 2, the first parts $30_1$, $30_2$, $30_3$, $30_4$ and respective second parts $31_2$, $31_3$, $31_4$) are such as to prevent light loss or etendue increase in a manner similar to the first embodiment of the apparatus 1 described with reference to FIG. 3. More specifically, as shown in FIGS. 11A and 11B, the refractive indices of the first parts $30_1$, $30_2$, $30_3$, $30_4$ are made sufficiently larger than the refractive indices of the medium 10 and respective adjacent second parts $31_2$, $31_3$, $31_4$ and the light guide 2, to prevent the light traveling directly through the first parts $30_1$ through $30_4$ from passing directly into the medium 10 at an angle at which it would be lost, and also to prevent light reflected from interfaces $32_1$ through $32_4$ from being transmitted through interfaces 8, $33_{12}$, $33_{23}$, $33_{34}$. If the interfaces 8, $33_{12}$, $33_{23}$, $33_{34}$ are composed of cement, gel or other suitable film layer with refractive indices different from those of the neighboring parts then, alternatively, the index of the film layer can be chosen to prevent light reflected from interfaces $32_1$ through $32_4$ from being transmitted through the interfaces 8, $33_{12}$, $33_{23}$, $33_{34}$.

Figure 12:
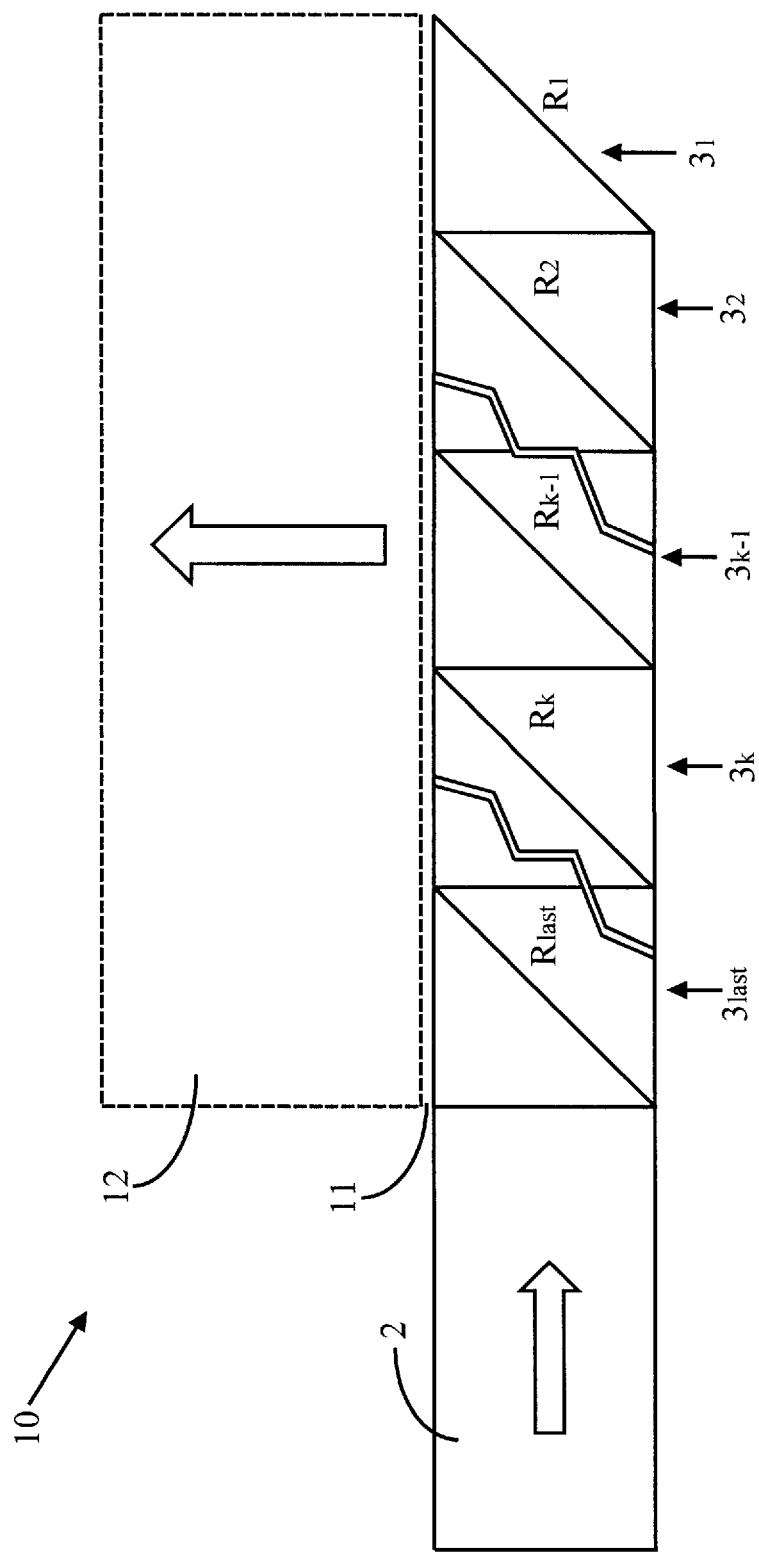
FIG. 12 is a side elevation view of the second embodiment of the invented apparatus, showing the reflective surfaces of its redirection members.

As shown in FIG. 11A, the output light intensity of the second embodiment of the invented apparatus 1 can be made highly uniform, a feature which is useful for uniformly irradiating resists for photolithography over relatively large substrates. To produce a uniform light field, the reflectances (and hence the transmittances that are equal to one minus the respective reflectance assuming no absorption) at each of the interfaces $32_1$, $32_2$, $32_3$, $32_4$ must be carefully designed to make a uniform output light intensity possible over the entire extent of the output surfaces $6_1$, $6_2$, $6_3$, $6_4$. FIG. 12 shows a generalized diagram to demonstrate how the reflectances for the interfaces between the first and second parts, can be determined for an arbitrary number of combined beam splitters 3. To make the output light field uniform, the reflectance $R_k$ of the Kth member $3_k$ counting from the first toward the last member 3, is given by the following equation:

$$\frac{1}{R_K} = \frac{1}{A^{K-1}R_1} + \frac{\frac{1}{A^{K-1}} - 1}{\frac{1}{A} - 1} \quad (4)$$

where $R_1$ is a reflectance of member $3_1$, A is a bulk transmittance of each member $3_1, 3_2, \ldots, 3_{LAST}$ that is equal to one minus a bulk absorption. Equation (4) is used when the absorption of light in the members $3_1, 3_2, \ldots, 3_{LAST}$ is sufficiently high that it must be considered (i.e., $A \neq 1$). If highly transmissive materials are used in the light guide 2 and the members 3, the reflectance $R_K$ for the Kth interface between the first and second parts of the Kth member $3_k$ is given by the following equation:

$$\frac{1}{R_K} = K + \left(\frac{1}{R_1} - 1\right) \quad (5)$$

where $R_1$ is a reflectance of the reflective surface of the first member $3_1$, and where the bulk transmittances of the members are each approximately equal to one, i.e., the substance forming the members 3 absorbs little or no light.

Figure 13:
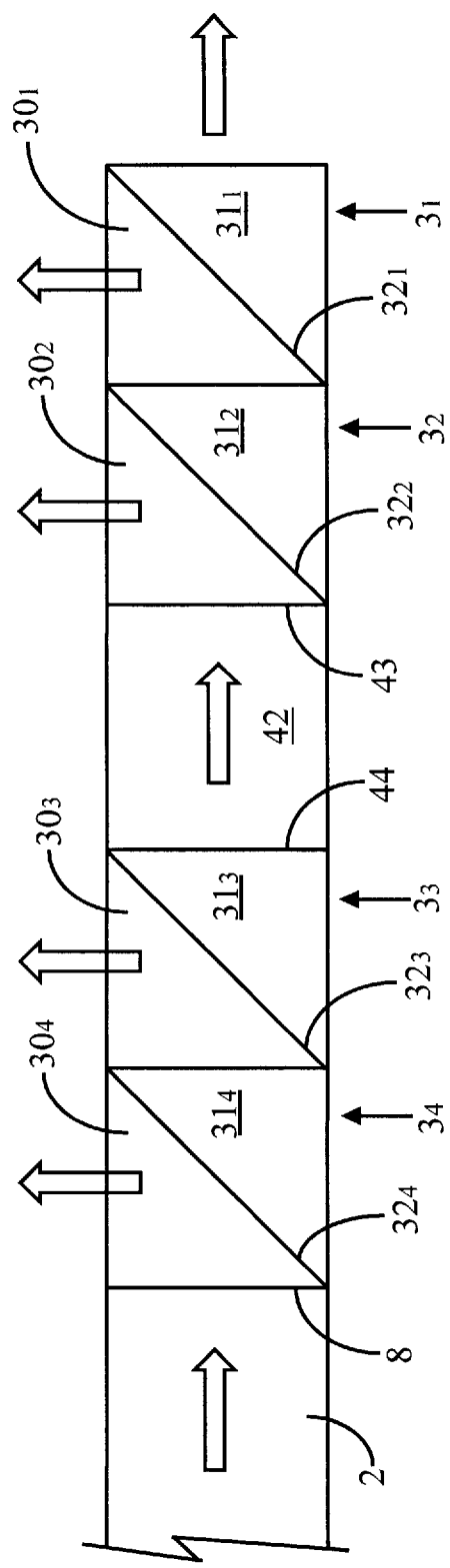
FIG. 13 side elevation view of a variation of the second embodiment of the invented apparatus.

FIG. 13 is a variation of the second embodiment of the apparatus 1 illustrated in FIGS. 9A, 9B, 11A, 11B and 12 in which an additional light guide 42 is coupled between the members $3_2$, $3_3$ with the members $3_1$, $3_2$ at one end, and the members $3_3$, $3_4$ at its other end. The light guide 42 serves to couple light transmitted through the member $3_3$ to the member $3_2$, and to separate the members $3_1$, $3_2$ from the members $3_3$, $3_4$, to produce two separate, uniform light fields. The specific variation of the apparatus 1 shown in FIG. 13 is given by way of example, and not limitation. Accordingly, the number of members 3 in each separated group of members, can be greater or fewer than the two shown in FIG. 13 without departing from the scope of this invention. Also, more than two fields can be produced by using more than two groups of members 3 coupled together with a plurality of light guides 42 separating each adjacent group of members 3.

Preferably, to simplify the calculation of the reflectances of the interfaces $32_x$, the bulk transmittance of the light guide(s) 42 should be approximately one and its refractive index should be the same as that of the second parts $31_x$. If differences in refractive index between elements $30_x$ and elements $31_x$ are used to properly constrain the light so that good uniformity is achieved, then the optimum index of refraction for the cements or gels used in the interfaces between the beam splitter cubes and the light guides would have a refractive index intermediate between those of the materials on either side. If the refractive index of the interfaces is used to properly constrain the light so that good uniformity is achieved, then the refractive index of the interface is required to be substantially lower than the refractive index of the beam-splitter elements $30_x$ to achieve the desired result. In either case, neglecting light loss due to reflections from the interfaces between the beam-splitter cubes and light guides, the optimum reflectance for each beam-splitter surface, assuming uniform light output is desired, is given by equation (5).

The many features and advantages of the present invention are apparent from the detailed specification and thus, it is intended by the appended claims to cover all such features and advantages of the described apparatuses and systems which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

I claim:

1. An apparatus for receiving and redirecting light, the apparatus comprising:

a first light guide having an input surface and an output surface and a first selected refractive index, said first light guide input surface disposed to receive at least a portion of the light;

a first redirection member having an input surface, an output surface and a reflective surface and a second selected refractive index, with said first redirection member input surface disposed to receive light traveling along a first general direction from the first light guide output surface with the reflective surface redirecting light traveling in the first general direction to a second general direction to the first redirection member output surface;

a first interface, having a third selected refractive index, situated between the first light guide output surface and the first redirection member input surface; and a medium, having a fourth selected refractive index, situated adjacent to the first redirection member output surface to receive the light traveling generally along the second direction from the first redirection member;

wherein the first, second, third and fourth refractive indices are each selected to spatially confine the light in the first redirection member until the light is redirected in the first redirection member to travel along the second general direction to the medium.

2. An apparatus as claimed in claim 1, wherein the first light guide includes glass.

3. An apparatus as claimed in claim 1, wherein the first light guide includes crystal.

4. An apparatus as claimed in claim 1, wherein the first light guide includes plastic.

5. An apparatus as claimed in claim 1, wherein the first interface includes a light-transmissive cement layer that adheres the first light guide output surface to the first redirection member input surface.

6. An apparatus as claimed in claim 1, wherein the first interface includes a light-transmissive gel layer.

7. An apparatus as claimed in claim 6, further comprising:
at least one support member to support the first light guide in a fixed position relative to the redirection member.

8. An apparatus as claimed in claim 1, wherein the first interface includes a gap filled with a gas.

9. An apparatus as claimed in claim 8, further comprising:
at least one support member to support the first light guide in a fixed position relative to the redirection member.

10. An apparatus as claimed in claim 8, wherein the gas includes ambient air.

11. An apparatus as claimed in claim 1, wherein the first interface includes a vacuum.

12. An apparatus as claimed in claim 11, further comprising:
at least one support member to support the first light guide in a fixed position relative to the redirection member.

13. An apparatus as claimed in claim 1, wherein the redirection member includes glass.

14. An apparatus as claimed in claim 1, wherein the redirection member includes crystal.

15. An apparatus as claimed in claim 1, wherein the redirection member includes plastic.

16. An apparatus as claimed in claim 1, wherein the redirection member includes a prism.

17. An apparatus as claimed in claim 1, wherein the redirection member includes a beam splitter.

18. An apparatus as claimed in claim 1, wherein the medium includes a gas.

19. An apparatus as claimed in claim 18, wherein the gas includes ambient air.

20. An apparatus as claimed in claim 1, wherein the medium includes a vacuum.

21. An apparatus as claimed in claim 1:
wherein the medium includes:
a second interface, having the fourth selected refractive index, adjacent the first redirection member output surface; and a component having an input surface and an output surface and a fifth selected refractive index, with the component input surface adjacent the second interface;

wherein the second selected refractive index of the first redirection member relative to one of the fourth and fifth refractive indices of one of the second interface and the component are selected to confine the light traveling in the first general direction in the first redirection member until the light is redirected in the first redirection member to travel along the second direction.

22. An apparatus as claimed in claim 21, wherein the component includes a second light guide.

23. An apparatus as claimed in claim 21, wherein the component includes a second redirection member redirecting the light traveling along the second general direction, to a third general direction.

24. An apparatus as claimed in claim 21, wherein the entire component input surface opposes the entire redirection member output surface.

25. An apparatus as claimed in claim 24, wherein the entire first redirection input surface opposes the entire first light guide output surface.

26. An apparatus as claimed in claim 1, further comprising:
a second light guide having an input surface, an output surface and the first selected refractive index with the second light guide input surface receiving at least a portion of the light;

a second redirection member having an input surface, an output surface and a reflective surface and the second selected refractive index with the second redirection member input surface arranged to receive light traveling along a third general direction from the second light guide, and the second redirection member reflective surface to redirect light traveling in the third general direction to the second general direction;

a second interface, having the third selected refractive index, situated between the second light guide output surface and the second redirection member input surface;

wherein the medium is also situated adjacent to the second redirection member output surface, to receive the light traveling generally along the second direction from the second redirection member; and wherein the first, second, third and fourth refractive indices are each selected to spatially confine the light in the second redirection member until the light is redirected in the second redirection member to travel along the second general direction to the medium.

27. An apparatus as claimed in claim 26, wherein the input surfaces of the first and second light guides are juxtaposed to receive light from a common light source.

28. An apparatus for receiving and redirecting light, the apparatus comprising:
a first light guide receiving and guiding light to a surface thereof, the first light guide having a first refractive index;

a first interface layer contacting the first light guide's surface, the first interface layer having a second refractive index;

a first light redirection member having first and second surfaces, and a reflective surface positioned with respect to the first and second surfaces to generally direct light from the first surface toward the second surface, the first surface contacting the first interface layer and opposing the surface of the first light guide, the first light redirection member having a third refractive index; and a light-transmissive medium situated adjacent to the first light redirection member's second surface, having a fourth refractive index;

the third refractive index is sufficiently greater than one of the first and second refractive indices to cause substantially all of the light from the first light guide to travel through the first interface layer into the first light redirection member, and to cause substantially all of the light reflected from the first light redirection member's reflective surface to the first light redirection member's first surface to be further reflected to the first light redirection member's second surface, and the third refractive index is sufficiently greater than the fourth refractive index of the light-transmissive medium to cause substantially all of the light passing directly from the first light guide through the interface layer directly to the first light redirection member's second surface to be reflected to the first light redirection member's reflective surface, and to cause the light reflected from the first light redirection member's first surface to the first light redirection member's second surface and the light reflected directly from the first light redirection member's reflective surface to the first light redirection member's second surface to pass through the first light redirection member's second surface into the light-transmissive medium.

29. An apparatus as claimed in claim 28 wherein:

the light-transmissive medium includes:

a second interface layer having the fourth refractive index and is adjacent to the first light redirection member's second surface; and a component, having a first surface and a second surface and a fifth refractive index, with the component's first surface facing the first light redirection member's second surface through the second interface layer; and wherein the third refractive index is sufficiently larger than the respective fourth and fifth refractive indices of the second interface layer and the component with the light passing directly from the first light guide through the first interface layer directly to the first light redirection member's second surface reflected to the first light redirection member's reflective surface, and with the light reflected from the first light redirection member's first surface and the light traveling directly from the first light redirection member's reflective surface to the first light redirection member's second surface passing through the first light redirection member's second surface and the second interface layer into the component.

30. An apparatus as claimed in claim 28, further comprising:

a second light guide receiving and guiding light to a surface thereof, the second light guide having a fifth refractive index;

a second interface layer contacting the surface of the second light guide, the second interface layer having a sixth refractive index;

a second light redirection member having first and second surfaces, and a reflective surface positioned with respect to the first and second surfaces to direct light from the second light redirection member's first surface generally toward the second light redirection member's second surface, the second light redirection member's first surface contacting the second interface layer and opposing the surface of the second light guide, the second light redirection member's second surface situated adjacent to a portion of the light-transmissive medium, and the second light redirection member having a seventh refractive index;

wherein the seventh refractive index is sufficiently greater than one of the fifth and sixth refractive indices to cause substantially all of the light from the light-transmissive medium to be reflected from the second light redirection member's reflective surface to the second light redirection member's first surface to be further reflected to the second light redirection member's second surface, and;

wherein the seventh refractive index is sufficiently greater than the fourth refractive index to cause substantially all of the light from the second light guide to travel through the second interface layer into the second light redirection member, and to cause substantially all of the light reflected from the second light redirection member's reflective surface to the second light redirection member's first surface to be further reflected to the second light redirection member's second surface.

31. An apparatus as claimed in claim 30, wherein input surfaces of the first and second light guides are juxtaposed to receive light from a common light source.

32. An apparatus as claimed in claim 30 wherein:

the light-transmissive medium includes:

a third interface layer having the fourth refractive index and is adjacent to the first light redirection member's second surface; and a component, having a first surface and a second surface and a fifth refractive index, with the component's first surface facing the first and second light redirection members' second surfaces through the third interface layer; and wherein the respective third and seventh refractive indices of the first and second light redirection members are sufficiently larger than at least one of the fourth and fifth refractive indices of the third interface layer and the component with substantially all of the light from the first and second light guides traveling directly to the second surfaces of the first and second light redirection members being reflected to the reflective surfaces of the first and second light redirection members for redirection along the second general direction.

33. An apparatus as claimed in claim 32, wherein the component includes a third light guide.

34. An apparatus as claimed in claim 32, wherein the component includes a third redirection member.

35. An apparatus as claimed in claim 28, wherein the medium includes a gas.

36. An apparatus as claimed in claim 35, wherein the gas includes ambient air.

37. An apparatus as claimed in claim 28, wherein the medium includes a vacuum.

38. An apparatus for receiving and redirecting light, the apparatus comprising:

a plurality of redirection members arranged in succession, at least one of the plurality of redirection members having first and second parts with a partially reflective, partially transmissive first interface arranged between respective first and second parts, the first interface angled relative to a first general direction in which light travels from an input redirection member to an end redirection member through partial transmission through the first interface, to cause the light reflected from the first interface to be redirected from the first general direction to a second general direction, a second interface arranged between adjacent redirection members, the second interface approximately normal to the first general direction; and a medium situated adjacent to the redirection members, receiving the light traveling along the second general direction, and wherein the relative refractive indices of the first and second parts of the at least one redirection member, the medium and an adjacent redirection member are each selected to confine the light reflected from the interfaces in respective redirection members until the light is redirected in the first part to travel along the second general direction to the medium.

39. An apparatus as claimed in claim 38, wherein a reflectance of a Kth redirection member counting from the end redirection member toward the input redirection member, has a reflectance $R_K$ at least approximately given by the equation:

$$\frac{1}{R_K} = \frac{1}{A^{K-1}R_1} + \frac{\frac{1}{A^{K-1}} - 1}{\frac{1}{A} - 1}$$

where $R_1$ is a reflectance of the end redirection member, A is a bulk transmittance of each redirection member, that is equal to 1 minus a bulk absorption, and where $A \neq 1$.

40. An apparatus as claimed in claim 38, wherein a reflectance of a Kth redirection member counting from the end redirection member to the input redirection member, has a reflectance $R_K$ at least approximately given by the equation:

$$\frac{1}{R_K} = K + \left(\frac{1}{R_1} - 1\right)$$

where $R_1$ is a reflectance of the end redirection member, and where the redirection members absorb no significant amount of light.

41. An apparatus as claimed in claim 38, further comprising:

a first light guide receiving the light at a first end thereof and guiding the light to a second end opposite the first end, the second end contacting the input redirection member to supply the light thereto.

42. An apparatus as claimed in claim 41, further comprising:

a light source generating light directed to the first end of the first light guide.

43. An apparatus as claimed in claim 38, further comprising:

at least one additional light guide, coupled to and guiding light between a pair of redirection members, to produce at least two separated, uniform light fields in the medium.

44. An apparatus as claimed in claim 38, wherein at least one of the redirection members is a beam splitter.

45. An apparatus for receiving and redirecting light, the apparatus comprising:

a first light guide, having first and second ends, to guide light traveling along a first general direction from the first to the second end; and a first redirection member coupled to the second end of the first light guide to couple light traveling in the first general direction into a second general direction;

wherein the relative refractive indices of the first light guide and the first redirection member are selected to confine the light in the first redirection member until redirected between the first and second general directions.

46. An apparatus as claimed in claim 45, wherein the relative refractive indices of the first light guide and the first redirection member satisfy the relation:

$$\sin \theta_{incident} > \frac{n_{lightguide}}{n_{member}}$$

where $\theta_{incident}$ is the largest angle of incidence of light traveling between the first light guide and the first redirection member, $\eta_{lightguide}$ is the refractive index of the first light guide, and $\eta_{member}$ is the refractive index of the first redirection member.

47. An apparatus as claimed in claim 46, wherein $\theta_{incident}$ is determined based on a predetermined redirection angle between the first and second general directions, and a largest angular spread of light traveling between the first light guide and the first redirection member.

48. An apparatus as claimed in claim 45, further comprising:

an interface coupled between the first light guide and the first redirection member, wherein relative refractive indices of the first light guide, the first redirection member and the interface satisfy the relation:

$$\sin \theta_{incident} > \text{the smaller of } \frac{n_{lightguide}}{n_{member}} \text{ or } \frac{n_{interface}}{n_{member}}$$

where $\theta_{incident}$ is the largest angle of incidence of light traveling between the first light guide and the first redirection member, $\eta_{lightguide}$ is the refractive index of the first light guide, $\eta_{member}$ is the refractive index of the first redirection member, and $\eta_{interface}$ is the refractive index of the interface.

49. An apparatus as claimed in claim 48, wherein $\theta_{incident}$ is determined based on a predetermined redirection angle between the first and second general directions, and a largest angular spread of light traveling between the first light guide and the first redirection member.

50. An apparatus as claimed in claim 45, further comprising:

a second light guide, having first and second ends, to guide light traveling along the first general direction from the first to the second end; and a second redirection member coupled to the second end of the first light guide to couple light traveling between the first general direction and the second general direction;

wherein the relative refractive indices of the second light guide and the second redirection member are selected to confine the light in the second redirection member until redirected between the first and second general directions;

wherein the first ends of the first and second light guides are juxtaposed to receive the light generated by a common source.

51. An apparatus as claimed in claim 50, further comprising:

a sheet defining first and second apertures overlapping along a predetermined direction, wherein the first light guide and the first redirection member redirect light to the sheet's first aperture, and the second light guide and the second redirection member redirect light to the sheet's second aperture;

a reticle having a pattern through which the light from the sheet's first and second apertures passes;

at least one first fold mirror situated to receive light passing from the sheet's first aperture through the reticle;

a first scanning array lens lithography system receiving light from the first fold mirror;

at least one second fold mirror situated to receive light passing through the sheet's second aperture through the reticle; and a second scanning array lens lithography system receiving light from the second fold mirror;

wherein the first and second scanning array lens lithography systems direct the light patterns from the sheet's first and second apertures via the first and second fold mirrors to selectively irradiate a resist layer on a substrate.

52. An apparatus as claimed in claim 51, wherein the reticle and substrate are movable relative to the first and second light guides, the first and second redirection members, the sheet and the first and second scanning array lens lithography systems.

53. An apparatus as claimed in claim 26, wherein the medium includes:

a third interface, having the fourth selected refractive index, adjacent the output surfaces of both of the first and second redirection members; and a component having an input surface and an output surface and a fifth selected refractive index, with the component input surface adjacent the second interface.

54. An apparatus as claimed in claim 53, wherein the entire component input surface opposes both entire output surfaces of both of the first and second redirection members.

55. An apparatus as claimed in claim 54, wherein:

the entire first redirection input surface opposes the entire first light guide output surface; and the entire second redirection input surface opposes the entire second light guide output surface.

\* \* \* \* \*